US011231333B2

United States Patent
Hofmann

(10) Patent No.: US 11,231,333 B2
(45) Date of Patent: Jan. 25, 2022

(54) DEVICE AND METHOD FOR MEASURING MECHANICAL STRESS BASED ON MAGNETOSTRICTION

(71) Applicant: Hochschule für angewandte Wissenschaften Würzburg-Schweinfurt, Würzburg (DE)

(72) Inventor: Alexander Hofmann, Erlangen (DE)

(73) Assignee: Hochschule für angewandte Wissenschaften Würzburg-Schweinfurt, Würzburg (DE)

(*) Notice: Subject to any disclaimer, the term of this patent is extended or adjusted under 35 U.S.C. 154(b) by 126 days.

(21) Appl. No.: 16/880,613

(22) Filed: May 21, 2020

(65) Prior Publication Data

US 2020/0378844 A1     Dec. 3, 2020

(30) Foreign Application Priority Data

May 27, 2019   (EP) ..................................... 19176709

(51) Int. Cl.
   *G01L 1/12*    (2006.01)
   *H01L 41/12*   (2006.01)
   *G01L 3/10*    (2006.01)

(52) U.S. Cl.
   CPC ............ *G01L 1/125* (2013.01); *H01L 41/125* (2013.01); *G01L 3/102* (2013.01)

(58) Field of Classification Search
   None
   See application file for complete search history.

(56) References Cited

U.S. PATENT DOCUMENTS 3,299,382 A * 1/1967 Tanaka ................... G01L 1/127
                                                    336/20
3,302,456 A * 2/1967 Guerth ................... G01L 3/102
                                                    73/862.333

(Continued)

FOREIGN PATENT DOCUMENTS

| DE | 4203124 A1  | 8/1992 |
| DE | 19702519 A1 | 7/1997 |

(Continued)

OTHER PUBLICATIONS

European Patent Office, Extended European Search Report, Application No. 19176709.4, dated Dec. 4, 2019, 7 pages.

*Primary Examiner* — Herbert K Roberts
(74) *Attorney, Agent, or Firm* — Sunstein LLP

(57) ABSTRACT

Disclosed herein is a device for measuring mechanical stress. The device comprises a magnetostrictive body enclosing a remanent magnetization. The magnetostrictive body comprises first and second end surfaces that are arranged opposite to each other. At least one of the first and second end surfaces is configured to receive a mechanical stress. The magnetostrictive body further comprises a first recess formed at the first end surface towards the second end surface and a second recess formed at the second end surface towards the first end surface. In a projection perpendicular to the first end surface, the first recess overlaps the second recess and extends beyond the second recess. Further disclosed are a method of manufacturing such a device and a method of measuring mechanical stress using such a device.

20 Claims, 15 Drawing Sheets

(56) References Cited

U.S. PATENT DOCUMENTS

| | | | | |
|---|---|---|---|---|
| 4,088,013 | A * | 5/1978 | Dahle | G01B 7/24 |
| | | | | 73/779 |
| 4,467,662 | A | 8/1984 | Valdemarsson | |
| 4,697,460 | A * | 10/1987 | Sugiyama | G01L 3/1435 |
| | | | | 324/209 |
| 4,803,885 | A * | 2/1989 | Nonomura | G01L 3/102 |
| | | | | 73/862.333 |
| 4,825,709 | A * | 5/1989 | Nordvall | G01L 1/125 |
| | | | | 73/862.69 |
| 6,220,105 | B1 * | 4/2001 | Cripe | G01L 1/125 |
| | | | | 73/862.333 |
| 10,866,149 | B1 * | 12/2020 | Yoo | G01N 29/4454 |
| 2003/0115972 | A1 * | 6/2003 | May | G01L 3/102 |
| | | | | 73/862.333 |
| 2010/0116066 | A1 * | 5/2010 | Mizuno | G01L 5/13 |
| | | | | 73/862.69 |
| 2010/0127698 | A1 * | 5/2010 | Shimada | G01L 1/125 |
| | | | | 324/209 |
| 2011/0126640 | A1 * | 6/2011 | Klode | G01L 1/125 |
| | | | | 73/862.333 |
| 2014/0041461 | A1 * | 2/2014 | Ueno | G01L 5/169 |
| | | | | 73/862.625 |
| 2016/0276958 | A1 * | 9/2016 | Viala | H01L 41/125 |
| 2019/0107449 | A1 * | 4/2019 | Wakiwaka | G01L 3/102 |

FOREIGN PATENT DOCUMENTS

| | | | | |
|---|---|---|---|---|
| DE | 692 22 588 T2 | | 5/1998 | |
| DE | 102011082122 A1 * | | 3/2013 | G01L 1/125 |
| EP | 0 092 125 A1 | | 10/1983 | |
| EP | 0 525 551 B1 | | 10/1997 | |
| FR | 2292212 | | 6/1976 | |
| GB | 1517758 | | 7/1978 | |
| WO | WO-2018054421 A * | | 3/2018 | G01L 3/102 |

\* cited by examiner

DEVICE AND METHOD FOR MEASURING MECHANICAL STRESS BASED ON MAGNETOSTRICTION

FIELD OF THE INVENTION

The present disclosure relates to detecting and quantifying a mechanical stress based on the principles of magnetostriction. In particular, the present disclosure relates to a device and a method for measuring mechanical stress acting on a magnetostrictive body.

BACKGROUND OF THE INVENTION

The determination of mechanical stresses, forces or torques acting on a component is of a great importance in a wide variety of technical fields, in particular for the purpose of designing, construction and maintenance of a device, machine, structure or construction.

Some materials are capable of changing their shape and/or dimensions in response to being magnetized. This property is also referred to as the magnetostriction or the Joule effect. Similarly, these materials may also perform a change of the magnetic susceptibility when subjected to a mechanical stress. This may be referred to as the Villari effect. Hence, the Joule effect and/or the Villari effect may be exploited for determining a mechanical stress acting on a magnetostrictive body.

SUMMARY OF THE INVENTION

It is an objective of the present invention to provide a device for measuring mechanical stress based on magnetostriction that can be manufactured in a simple and cost effective manner. The device as disclosed herein may exhibit robustness and rigidity against an externally applied mechanical stress, in particular in the direction of the applied mechanical stress. The device may exhibit a sufficient inelasticity and/or sufficient mechanical stability against deformation. Further, the device according to the present invention provides a satisfactory robustness against environmental influences and disturbances. A further object of the present invention is to provide a corresponding method for measuring mechanical stress.

The problem underlying the present invention is solved by a device for measuring mechanical stress comprising a magnetostrictive body according to claim 1. The problem is further solved by a method according to claim 13 and a method according to claim 15.

Disclosed herein is a device for measuring mechanical stress. The device comprises a magnetostrictive body. The magnetostrictive body encloses a remanent magnetization. The magnetostrictive body comprises a first end surface and a second end surface that are arranged opposite to each other. The first end surface and/or the second end surface of the magnetostrictive body may be configured and/or arranged such to receive a mechanical stress. The magnetostrictive body further comprises a first recess formed at the first end surface towards the second end surface. The magnetostrictive body further comprises a second recess formed at the second end surface towards the first end surface. The first recess and the second recess are arranged such that, in a projection perpendicular to the first end surface, the first recess overlaps the second recess and extends beyond the second recess. In particular, the first recess may partially, i.e. not entirely, overlap the second recess.

The device of the present disclosure may allow for detecting and quantifying the mechanical force that is applied to the magnetostrictive body. The device may be manufactured in a relatively simple and/or cost effective manner. The device as disclosed herein may exhibit robustness and rigidity against an externally applied mechanical stress, in particular in the direction of the applied mechanical stress. The device may exhibit a sufficient inelasticity and/or sufficient mechanical stability against deformation. The device may be resistant against environmental influences and disturbances, such as temperature fluctuations and humidity.

The device for measuring mechanical stress may also be referred to as a force sensing device. In the present disclosure, the term mechanical stress may refer to a force and/or to a torque acting on one or both of the end surfaces of the magnetostrictive body. In a specific example, the stress may refer to a ratio of the magnitude of a force applied to the area of the receiving end surface of the magnetostrictive body. In addition, the mechanical stress may take into account a direction of the applied force with respect to the end surface of the magnetostrictive body. The relation between the force and the corresponding mechanical stress may be determined as known in the art. For the sake of simplicity, the terms mechanical stress and force are used interchangeably in the following unless otherwise indicated.

The magnetostrictive body of the device according to the present disclosure is made of a magnetostrictive material. For example, the magnetostrictive body contains a ferromagnetic material, for example iron, nickel or cobalt, a combination thereof or an alloy containing the same. The magnetostrictive body may be configured to change an enclosed magnetization and/or the magnetic susceptibility in response to receiving a mechanical stress causing a strain. Accordingly, the direction and/or magnitude of the magnetization and/or the magnetic susceptibility within the magnetostrictive body may be affected by an external mechanical stress and the corresponding strain. In particular, the orientation of the magnetization and/or the magnetic susceptibility within the magnetostrictive body may be changed by means of a mechanical stress. In addition, the magnetostrictive body may be configured to change a dimension and/or a shape in response to an external magnetic field. In particular, the magnetostriction may refer to both expansion and contraction of the magnetostrictive body in response to receiving a mechanical stress. Depending on the material property of the magnetostrictive body, the magnitude and/or the direction of the mechanical stress, the magnetostrictive body may expand or contract. Accordingly, the magnetostriction as used herein may also include magneto-elastic properties.

The magnetostrictive body may have an internal structure that is divided into domains of respective uniform magnetic polarization. When an external magnetic field is applied, the boundaries between the domains may shift and/or the domains may rotate. Any of these effects may cause a change of one or more dimensions of the magnetostrictive body due to magnetocrystalline anisotropy, i.e. the fact that the energy required to magnetize a crystalline material differs in different directions. With the dimensions in different directions being different, this effect induces a strain in the material in response to an external magnetic field. Based on this principle, according to the Villari effect, the magnetostrictive body performs a change of the magnetic susceptibility, in particular its direction and/or magnitude, when subjected to a mechanical stress. However, it is understood that there may be further factors affecting the shift of the magnetic vector in the magnetostrictive body as a function of strain. Moreover, the magnetic fields that occur in real world systems are complex which is why the present disclosure is not necessarily a comprehensive explanation of the nature of the magnetic field changes that occur in the magnetostrictive body. Therefore, the present disclosure should be understood as a contribution towards understanding the magnetic effects which underlie the operation of the device as best known at this time.

In the present disclosure, the term magnetization may be used in accordance with the classical electrodynamics. In particular, the magnetization may refer to a vector field that expresses a density of magnetic dipole moments and may be indicative of the response of the magnetostrictive body to an external magnetic field. For example, the magnetization may be determined as a quantity of magnetic moment per unit volume.

The magnetostrictive body encloses a remanent magnetization. The remanent magnetization may refer to storing magnetization in the magnetostrictive body even when no external magnetic field is present. The remanent magnetization may also be referred to as remanence or residual magnetism, referring to the magnetization remaining in a zero field condition. In particular, the remanent magnetization as used in the present disclosure may be in accordance with the understanding from the classical electrodynamics.

The enclosing or enclosure of a remanent magnetization may refer to at least part of a magnetic field loop being located inside the magnetostrictive body. In particular, the magnetostrictive body enclosing a remanent magnetization may refer to an entire magnetic field loop being located inside the magnetostrictive body.

In some examples, the magnetostrictive body may be magnetized using an external magnetic field so as to maintain at least some of the magnetization even after the external magnetic field has been removed. In particular, the magnetostrictive body may be approached by a large external magnetic field until a saturation magnetization in the magnetostrictive body is achieved, upon which the external magnetic fields is removed. The magnetization in the magnetostrictive body that is left behind in absence of an external magnetic field, i.e. in a zero field condition, may be referred to as the remanent magnetization. In addition, the magnetostrictive body may contain an intrinsic magnetization component that is not induced by an external magnetic field. Such an intrinsic magnetization component may be at least partially compensated when magnetizing the magnetostrictive body.

For example, the magnetization in the magnetostrictive body may be determined via a magnetic hysteresis loop, e.g. using a vibrating sample magnetometer, in which the zero-field intercept may correspond to the enclosed remanent magnetization. Alternatively or additionally, the enclosed remanent magnetization may be determined from the relation between the magnetic field strength (H) and the flux density (B) in response to an AC magnetic field, for example by using a B-H analyzer.

In the present disclosure, the terms first and second end surfaces may refer to opposite surfaces of a specifically shaped magnetostrictive body. In particular, the end surfaces may correspond to end surfaces of a substantially cylindrical shape of the magnetostrictive body in contrast to a lateral surface. Additionally or alternatively, the magnetostrictive body may have a flat shape, for example a disk-like or plate-like shape, wherein the end surfaces refer to the two opposite flat surfaces.

The first end surface and/or the second end surface may be configured to receive a mechanical stress applied to the magnetostrictive body. For this purpose, the first end surface and/or the second end surface may be provided planar, flat or complementary to an element to which the magnetostrictive body is to be coupled. In particular, the magnetostrictive body may be coupled to a force transferring element, such as a shaft or anvil, such as to receive a mechanical stress acting thereto via one or both of the first end surface and the second end surface. The first and second end surfaces may be configured to receive mechanical stresses separately or at the same time.

In the present disclosure, the terms recess may refer generally to an area in which some of the material has been removed from the surface of the respective one of the first and second end surfaces. In particular, the first and second recesses are formed such that a (material) layer of the magnetostrictive body remains between the first recess and the second recess with respect to a direction perpendicular to the first end surface and/or the second end surface. This remaining (material) layer of the magnetostrictive body may be parallel to the first end surface and/or the second end surface.

The first recess may be formed by removing material from the first end surface. In particular, the first recess may be formed by subtractive manufacturing on the first end surface. Further, the first recess may be formed by lowering a portion of the first end surface in a perpendicular direction to the first end surface, thereby providing a lowered plane within the first recess that is arranged parallel to the first end surface. In some example, the first recess may be formed by cutting, machining, turning, drilling, milling, shaping, planing, boring, broaching, sawing, burnishing or any combination thereof according to the material, dimensions and shape of the first recess. The second recess may be formed in the same or a similar manner.

Alternatively or additionally, the first end surface and/or the second end surface may be formed by locally adding additional material on a surface of the magnetostrictive body except for area(s) in which the first recess and/or the second recess are to be formed, respectively. In some examples, the additional material may be attached to a main body of the magnetostrictive body and held onto it by external elements, such as mechanical stress transferring elements applying a mechanical stress onto the magnetostrictive body. Additionally or alternatively, the additional material may be bonded to a main body of the magnetostrictive body, in particular by means of additive manufacturing. The additive manufacturing may be performed, for example, by cladding, fusion welding, gluing or any other known additive manufacturing process. Moreover, providing the first end surface and/or the second end surface may involve a forming process, such as coining or extrusion.

Accordingly, the first and second recesses extend from the first end surface and the second end surface, respectively, in a direction perpendicular to the respective end surface insofar that an intermediate (material) layer of the magnetostrictive body remains between the first and second recesses. The intermediate (material) layer may be circumferentially closed. In particular, the intermediate (material) layer may contain a closed loop of the remanent magnetization enclosed in the magnetostrictive body.

A mechanical stress, compressive or tensile, that is applied to the first end surface, gives rise to a shear stress component in a direction perpendicular to the applied mechanical stress. In particular, the shear stress component emerges where the magnetostrictive body is recessed on both sides, i.e. where the first recess and the second recess overlap in a plan view. With the axial direction defining the x-axis, a simplified mathematical relation between a principal stress direction a1, tensile/compressional stress components σ(x), σ(y) and a shear stress component τ(xy) in two dimensions (i.e. non-collinear x and y directions, which may be orthogonal) is given as $$\alpha 1 = \frac{1}{2}\arctan\left(\frac{2\cdot\tau(xy)}{\sigma(x)-\sigma(y)}\right),$$

wherein the direction α1 indicates the angle formed between the resulting principal stress direction and the axial direction, i.e. x-axis. Accordingly, the resulting principal stress is inclined from the mechanical stress applied on the first end surface. The same may apply to a mechanical stress applied on the second end surface. It is understood that the shear stress component described above is an illustrative example to explain the functional principle of the device. In real systems, one or multiple additional shear stress components may occur according to the geometry of the magnetostrictive body and the received mechanical stress.

Based on the described principle, a mechanical stress applied perpendicular to any of the end surfaces of the magnetostrictive body may give rise to a stress component that is inclined from the direction of the mechanical stress and consequently generate a strain component in the same direction. This effect in particular occurs in an overlapping area of the first recess and the second recess, which is thinned down from both end surfaces of the magnetostrictive body and therefore particularly susceptible to distortion in the manner of a bending beam.

The resulting strain may cause the remanent magnetization to deflect from an initial alignment. Depending on the initial alignment of the remanent magnetization relative to the shape and dimensions of the magnetostrictive body, a magnetic field strength and/or direction of the remanent magnetization enclosed in the magnetostrictive body may vary as a function of the strain caused by the applied mechanical stress. As a result, a magnetic field vector of the remanent magnetization that can be measured outside of the magnetostrictive body may change. Such changes can be sensed with a magnetic field sensor. The magnetic field sensor may respond to a change in a magnetic field component in a given direction resulting from a change in the direction of the magnetic field vector at a given position. The mechanical stress may be determined on the basis of the measured magnetic field vector.

In a specific example, the initial alignment of the remanent magnetization may be entirely within the magnetostrictive body, e.g. arranged substantially parallel to the first end surface and/or the second end surface, and a part of the magnetic field vector may emerge from the magnetostrictive body in response to receiving a mechanical stress in the axial direction in the above described manner. The emerging magnetic field vector may be detectable using a magnetic field sensor. The enclosure of a closed loop of the remanent magnetization within the magnetostrictive body may be particularly preferable in terms of increased sensitivity of the emerging magnetic field vectors of the remanent magnetization by the magnetic field sensor.

In some examples, the device further comprises a magnetic field sensor. The magnetic field sensor may be arranged adjacent to the first end surface and/or the second end surface. The magnetic field sensor may be configured to measure a magnetic field vector emerging from the magnetostrictive body in response to a mechanical stress.

In particular, the magnetic field sensor may be configured to measure the magnetic field vector emerging from the magnetostrictive body in response to a mechanical stress in the above described manner. The magnetic field sensor may have a sensing area and be configured to detect and/or quantify a magnetic field vector penetrating a sensing area. The magnetic field sensor may be directional, i.e. sensitive to the orientation of the detector relative to the magnetic field vector to be measured. Some examples of the magnetic field sensor include one of a magnetic flux sensor of a saturating inductor type, an Hall effect sensor and a magnetoresistive sensor.

The arrangement of the magnetic field sensor adjacent to the first end surface and/or the second end surface allows for reducing the size of the device. Being arranged immediately at one of the end surfaces, a density of the magnetic field vector sensed by the magnetic field sensor may be increased. Accordingly, the sensitivity of the changes of the remanent magnetization may be increased. Additionally or alternatively, the exact positioning of the magnetic field sensor may be determined empirically. Generally, a preferable position of the magnetic field sensor may be determined based on, for example, the material, shape and dimensions of the magnetostrictive body as well as on the remanent magnetization enclosed in the magnetostrictive body. In addition, the exact positioning of the magnetic field sensor may also depend on the requirements to the device and the respective installment and application.

In particular, the magnetic field sensor may be arranged within or adjacent to the first recess or the second recess. Accordingly, the first recess and/or the second recess may contribute to providing an accommodation for the magnetic field sensor. The space requirement may be reduced in this manner. For this purpose, means for forwarding magnetic flux from the magnetostrictive body to the magnetic field sensor may be provided. For example, a magnetic flux conducting element made of a ferromagnetic material may be arranged between the magnetostrictive body and a magnetic field sensor. In a specific example, the magnetic flux conducting element may be further configured to hold the magnetic field sensor.

In some examples, the magnetostrictive body has a symmetric shape with respect to a symmetry axis that is arranged perpendicular to the first end surface. The symmetric shape may refer to a circular symmetry, in which a substantially unitary shape is maintained in a continuous manner when rotated around the symmetry axis, i.e. regardless of a rotation angle. Alternatively or additionally, the symmetric shape may refer to a rotational symmetry, in which a particular shape repeats at distinct rotation angles around the symmetry axis. Accordingly, the symmetric shape of the magnetostrictive body may refer to a projection perpendicular to the first end surface. The symmetric shape of the magnetostrictive body may be in accordance with a cylindrical symmetry wherein the cylinder axis corresponds to the symmetry axis.

Additionally or alternatively, the magnetostrictive body may have a symmetric shape with respect to a symmetry axis arranged perpendicular to the second end surface. In particular, the first end surface and the second end surface may be arranged parallel to each other such that the symmetry axis is perpendicular to both the first end surface and the second end surface.

The axially symmetrical shape of the magnetostrictive body may be exploited to enclose the remanent magnetization within the magnetostrictive body. In particular, a circular magnetization loop may be induced in the magnetostrictive body by rotating the magnetostrictive body around its symmetry axis. By this means, an entire loop of the remanent magnetization may be enclosed within the magnetostrictive body. This may be preferable to further increase the sensitivity of the emerging magnetic field vectors of the remanent magnetization by a magnetic field sensor as described above.

In some examples, the magnetostrictive body further comprises a through opening formed around the symmetry axis. The through opening of the present disclosure may refer to an opening formed between the first end surface and the second end surface such as to be open to both end surfaces. The through opening may be configured to receive, engage with, be attached to or be mounted on a mechanical stress transferring element, such as a shaft, a stage, an anvil, or the like. This may allow the device to be coupled to the respective element exerting the mechanical stress to be measured by the device.

The through opening may have a hollow cylindrical shape. The through opening may have a circular or polygonal cross-section, wherein the cross-section is a plane perpendicular to the symmetry axis. In a front and/or side view with respect to the device, the through opening may have a columnar shape. For example, the first end surface and the second end surface may be planar and arranged parallel to each other, and the through opening may have a hollow cylindrical shape with a circular cross-section in a plan view perpendicular to the first and second end surfaces and a rectangular cross-section and a top/side view perpendicular to the symmetry axis (i.e. in a radial projection).

In some examples, the first recess and/or the second recess extend in a radial direction with respect to the symmetry axis. In particular, the first recess and/or the second recess may extend in directions perpendicular to the symmetry axis. In particular, the first recess and/or the second recess may have a substantially flat surface. In addition, the first recess and/or the second recess may be arranged parallel to the first end surface and/or the second end surface. The first recess may be provided as a lowered area with respect to the first end surface extending in radial and circumferential directions. The first recess being lowered may refer to the first recess having a substantially flat surface parallel to the first end surface and being offset from the first end surface in a perpendicular direction into the magnetostrictive body.

Further, the same may apply to the second recess and the second end surface. Accordingly, the second recess may be provided as a lowered area with respect to the second end surface extending in radial and circumferential directions. As a result, an overlap portion may be formed where the magnetostrictive body is recessed on both sides, i.e. where the first recess and the second recess overlap in a plan view. As described above, a shear stress component perpendicular to the applied mechanical stress arises due to the geometry in the overlap portion. Consequently, the resulting strain deflects from the direction of the applied mechanical stress.

Furthermore, in examples where a through opening is formed between the first end surface and the second end surface, the first recess and/or the second recess may extend in radial direction between the through opening and a lateral boundary surface of the magnetostrictive body.

The first recess and/or the second recess may have the shape of a circular segment (cut from the center or annular), a polygonal segment, a groove shape, a fan shape or a combination thereof. In particular, the first recess and/or the second recess may have a shape corresponding to an annular shape of any of these examples.

In some examples, multiple first recesses are formed in the first end surface such that the multiple first recesses are spaced from one another in a circumferential direction with respect to the symmetry axis. In the projection perpendicular to the first end surface, at least one of the multiple first recesses overlaps the second recess and extends beyond the second recess. Additionally or alternatively, multiple second recesses may be formed the second end surface being spaced from one another in the circumferential direction. Each or at least one of the multiple first recesses may overlap one or more of the second recesses and vice versa. In particular, the multiple first and second recesses may be formed such that, in the projection perpendicular to the first end surface, each of the multiple first recesses partially overlaps one or more of the multiple second recesses and extends beyond the same.

Accordingly, multiple transition areas may be formed between each of the multiple first recesses and the first end surface, each transition area being inclined from the first end surface and extending in the axial and radial direction. The same may apply to the multiple second recesses, if applicable.

In some examples, the magnetostrictive body may further comprise at least one circumferential recess formed at the first end surface towards the second end surface. In particular, the at least one circumferential recess may be formed rotational symmetrically around the symmetry axis. The circumferential recess may extend in the circumferential direction around and perpendicular to the symmetry axis. Additionally or alternatively, at least one circumferential recess may be formed at the second end surface towards the first end surface in a similar manner. The circumferential recess may further contribute to the deflection of the remanent magnetization enclosed in the magnetostrictive body in response to the mechanical stress acting in the axial direction.

In some examples, the magnetostrictive body has an annular plate or annular cylinder shape. In particular, the annular plate or annular cylinder shape may be symmetrical with respect to the symmetry axis. Accordingly, the magnetostrictive body may be diskshaped with a circular through opening at the center. This shape may be advantageous for the induction of the remanent magnetization in the magnetostrictive body as described above.

In any example described in the present disclosure, the first end surface and the second end surface may be parallel or substantially parallel to each other. In this respect, the end surfaces being substantially parallel to each other may indicate that the first end surface and/or the second end surface may have a substantially flat surface and in addition some surficial features, such as a curvature, ridge, groove, bulge or the like. Further, the first end surface and/or the second end surface may contain surficial irregularities such as crevices or certain roughness as an undesired by-product from the manufacturing process.

In some examples, the remanent magnetization enclosed in the magnetostrictive body is arranged such to be substantially parallel to the first end surface and/or the second end surface. In particular, this may correspond to the initial alignment of the remanent magnetization as described above. Accordingly, the measurement of the emerging magnetic field vector may be facilitated.

The first recess may extend towards the second end surface by a first depth measured from and perpendicular to the first end surface. Similarly, the second recess may extend towards the first end surface by a second depth measured from and perpendicular to the second end surface. In some examples, the sum of the first depth and the second depth is smaller than a distance between the first end surface and the second end surface. Accordingly, the first recess and the second recess may be formed such that a plane of the magnetostrictive body remains between the first and second recesses as described above. In particular, in examples where multiple first recesses and/or multiple second recesses are formed at the respective end surface, the multiple first recesses may have a same first depth or a maximum first depth, and the multiple second recesses may have a same second depth or a maximum second depth, wherein the sums of the first and second depths or of the maximum first and second depths are smaller than the distance between the first and second end surfaces. The distance between the first and second end surfaces may refer to a thickness of the magnetostrictive body.

In some examples, the remanent magnetization enclosed in the magnetostrictive body may be equivalent to a magnetic flux density of 0.001 T to 1.0 T. Further preferred ranges of the remanent magnetization include, for example, 0.001 T to 0.5 T, 0.001 T to 0.3 T, 0.005 T to 1.0 T, 0.005 T to 0.5 T, 0.005 T to 0.3 T, 0.01 T to 1.0 T, 0.01 T to 0.5 T and 0.01 T to 0.3 T. In particular, the remanent magnetization may refer to a saturation magnetization that can be induced in the given magnetostrictive body, or 90% to 99.9% thereof, or 50% to 99.9% thereof, or 10% to 99.9% thereof. The remanent magnetization may depend on the material, shape and dimensions of the magnetostrictive body. Further, the remanent magnetization may depend on the alignment of the remanent magnetization relative to the shape and the dimensions of the magnetostrictive body. The magnetostrictive body may be made of a ferromagnetic material.

Further disclosed is a method of manufacturing a device for measuring mechanical stress, the device comprising a magnetostrictive body enclosing a remanent magnetization. Such a device may correspond to the above described device and/or any of its examples. According to the method, the remanent magnetization is enclosed in the magnetostrictive body by performing at least one of the following: applying an external magnetic field relative to the magnetostrictive body while rotating the magnetostrictive body relative to the external magnetic field; applying an external magnetic field to the magnetostrictive body while moving the magnetostrictive body in a closed loop (e.g. in a circular or elliptical loop) relative to the external magnetic field; applying an external magnetic field to the magnetostrictive body and periodically varying an orientation and/or magnitude of the external magnetic field relative to the magnetostrictive body; and applying an electric current through the magnetostrictive body and varying a direction and/or magnitude of the electric current. In particular, the device manufactured according to the method disclosed herein may enclose a closed loop of a remanent magnetization. Variation and adjustment of the magnetic field and/or the electric current applied to enclose a remanent magnetization in the magnetostrictive body may be as known in the relevant art. In a specific example, the magnetostrictive body is rotated while being exposed to a magnetic field so as to induce magnetization in the magnetostrictive body. The magnetic field is aligned relative to the magnetostrictive body and maintained such that the remanent magnetization is enclosed in the magnetostrictive body.

The term external magnetic field as used herein indicates a magnetic field in contrast to the remanent magnetization enclosed in the magnetostrictive body. The external magnetic field may be provided by a permanent magnet and/or an electromagnet. The external magnetic field may be strong enough to induce a remanent magnetization in the magnetostrictive body at the saturation level. For this purpose, the external magnetic field may be at least equivalent to the magnetic flux ranges as above indicated. In specific examples, the external magnetic field may have a magnetic field strength of 0.1 A/m to $10^6$ A/m, 1 A/m to $5 \cdot 10^5$ A/m, or 10 A/m to $10^5$ A/m.

While rotating the magnetostrictive body, the magnetic domains inside the magnetostrictive body align with the external magnetic field. Accordingly, by arranging the rotation axis of the magnetostrictive body and the external magnetic field in a proper manner relative to each other, a closed loop of magnetic field vectors of the remanent magnetization may be enclosed in the magnetostrictive body.

In some examples, the magnetostrictive body is rotated around a rotation axis that is perpendicular to the desired remanent magnetization. A closed loop of magnetic field vectors of the remanent magnetization may be enclosed in the magnetostrictive body in this manner. The rotation axis may also be perpendicular to the first end surface and/or the second end surface. In examples where the magnetostrictive body is symmetrical with respect to a symmetry axis, the rotation axis may be identical with, or at least parallel to, the symmetry axis. Alternatively or additionally, the remanent magnetization may be induced by applying an electric current through the magnetostrictive body. The electric current may be configured sufficiently high and oriented in accordance with the desired geometry and magnitude of the remanent magnetization to be enclosed in the magnetostrictive body. Any further known process may be applied to induce the desired remanent magnetization in the magnetostrictive body.

Further disclosed is a method for measuring mechanical stress using the device or any of its examples described above. According to the method, the device as described above is provided, and a mechanical stress is applied to the magnetostrictive body of the device in a first direction perpendicular to the first end surface. Alternatively or additionally, the mechanical stress is applied to the second end surface of the magnetostrictive body. A magnetic field vector emerges from the magnetostrictive body in a direction inclined from said first direction in response to the applied mechanical stress in the above described manner. The method further comprises measuring the emerging magnetic field vector. The mechanical stress is determined from the measured magnetic field vector.

According to the device and methods as disclosed herein, a mechanical stress that is applied perpendicular to an end surface of the magnetostrictive body, or the corresponding component of the mechanical stress, can be determined based on the principles of magnetostriction. This allows for providing means for measuring mechanical stress in a simple and cost-effective manner. When measuring the mechanical stress, sufficient robustness and rigidity may be maintained, in particular in the direction of the applied mechanical stress. Further, a sufficient inelasticity and/or sufficient mechanical stability against deformation may be achieved during the measurement of the mechanical stress. Further, the disclosed device is robust against environmental influences and disturbances.

DETAILED DESCRIPTION OF THE DRAWINGS

Figure 1:
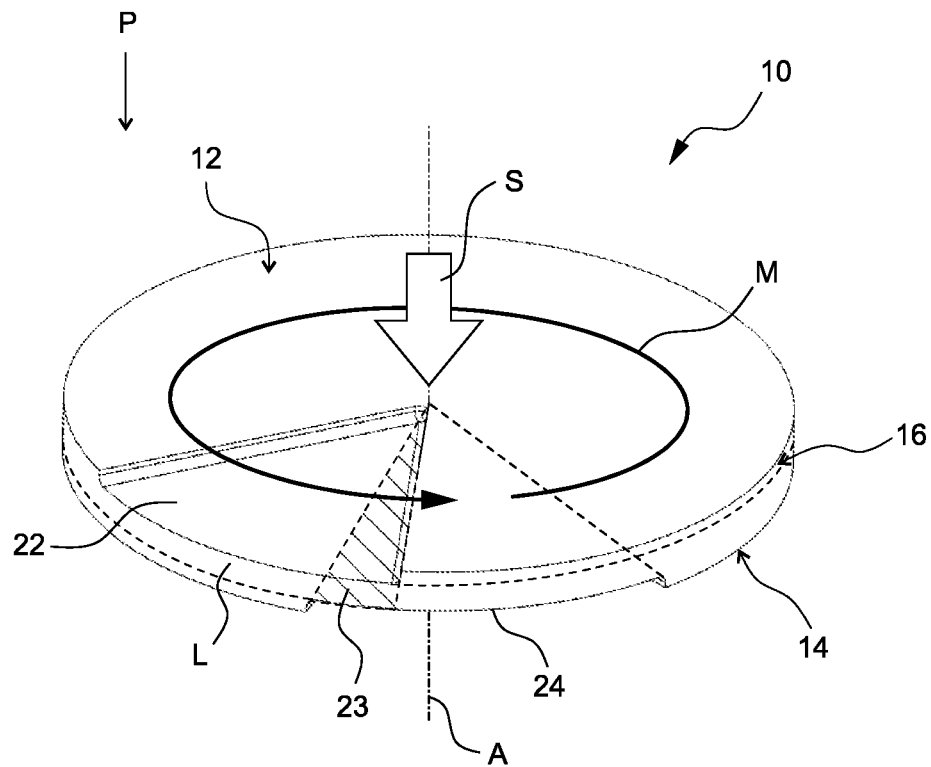
FIG. 1 is a schematic perspective view of an example of a magnetostrictive body.

In the following, same reference signs are used to indicate same or similar structural or functional features, unless otherwise indicated. The drawings of the present disclosure are used primarily for the purpose of illustration in order to facilitate the understanding of the claimed subject matter. Magnetization, magnetic regions and magnetic field vectors in real-world systems may be more complex than is illustrated in the drawings.

FIG. 1 shows a magnetostrictive body 10 according to an example. The magnetostrictive body 10 has a first end surface 12 and a second end surface 14 that are arranged opposite to each other. A lateral surface 16 of the magnetostrictive body 10 connects the first end surface 12 and the second end surface 14. The magnetostrictive body 10 is solid and has a disk-like shape that is substantially symmetrical around a symmetry axis A. The lateral surface 16 together with the first and second end surfaces 12, 14 may form outer boundary of the magnetostrictive body 10.

The first end surface 12 and the second end surface 14 are provided as planar surfaces. The first end surface 12 and the second end surface 14 are arranged parallel to each other. The first recess 22 is formed in the first end surface 12 towards the second end surface 14. The first recess 22 is formed as a lowered portion in the first end surface 12 and has the shape of a circular segment. The second recess 24 is formed in a similar manner in the opposite second end surface 14. The first recess 22 and the second recess 24 each extend in a radial direction with respect to the symmetry axis A. The first recess 22 and the second recess 24 in addition extend in a circumferential direction with respect to the symmetry axis A, resulting in a fan-like shape of a circular segment.

The magnetostrictive body 10 encloses a remanent magnetization M. The magnetic field vector of the remanent magnetization M forms a closed loop inside the magnetostrictive body 10. The remanent magnetization M may be enclosed in the magnetostrictive body 10 in the above described manner via induction by a strong external magnetic field. In FIG. 1, the remanent magnetization M is depicted in a counterclockwise direction. In other examples, the remanent magnetization M may be oriented in the reversed direction. In yet further examples, the remanent magnetization M may not be aligned perfectly parallel to any of the first and second end surfaces 12, 14, but slightly or significantly inclined. In the drawings of the present disclosure, the remanent magnetization M is depicted to form a closed loop in a plane. It is understood that, in real-world systems, the remanent magnetization M may deviate from a planar closed loop depending on the shape, dimensions, material property and other factors in accordance with the laws of electrodynamics, mechanics and material engineering. In those cases, the examples illustrated and described in the present disclosure may yet provide approximate models to describe the real-world systems.

The first recess 22 and the second recess 24 extend in the direction perpendicular to the first end surface 12 and the second end surface 14, respectively, to a respective depth. The sum of the depths is smaller than a distance between the first end surface 12 and the second end surface 14. Accordingly, a layer L exists within the magnetostrictive body 10 between the first recess 22 and the second recess 24. In particular, the layer L may be parallel to the first end surface 12 and/or the second end surface 14. The layer L terminates in the radial direction at the lateral surface 16. The remanent magnetization M may be provided such to be enclosed in the magnetostrictive body 10 as a closed loop inside the layer L.

In a projection P perpendicular to the first end surface 12 as shown in FIG. 1, i.e. in a plan view, the first recess 22 overlaps the second recess 24. In the same projection P, the first recess 22 further extends beyond the second recess 24. Accordingly, in said projection P, the first recess 22 and the second recess 24 are offset from each other in a circumferential direction. Moreover, an overlap portion 23 exists that is overlapped by both of the first recess 22 and the second recess 24 in the projection P. The overlap portion 23 may be a section of the layer L, as shown in FIG. 1.

If a mechanical stress S is applied to the magnetostrictive body 10 in a direction perpendicular to the first end surface 12, the resulting strain from the received mechanical stress S deflects from the axial direction (which is parallel to the symmetry axis A) based on the principles described above. Accordingly, the magnetostrictive body 10 undergoes a distortion particularly in the overlap portion 23. As a result, a magnetic field vector of the remanent magnetization M emerges from the magnetostrictive body 10.

The emerging magnetic field vector M' of the remanent magnetization M from the magnetostrictive body 10 can be measured using a magnetic field sensor outside of the magnetostrictive body 10. The magnetic field sensor may be arranged adjacent to any of the first end surface 12 and the second end surface 14. In particular, the magnetic field sensor may be arranged within one of the first recess 22 and the second recess 24. The magnetic field sensor may be arranged and/or specified as described above. In addition, means for forwarding the magnetic flux, such as a magnetic flux conducting element, from the magnetostrictive body 10 to the magnetic field sensor may be provided.

Figure 2:
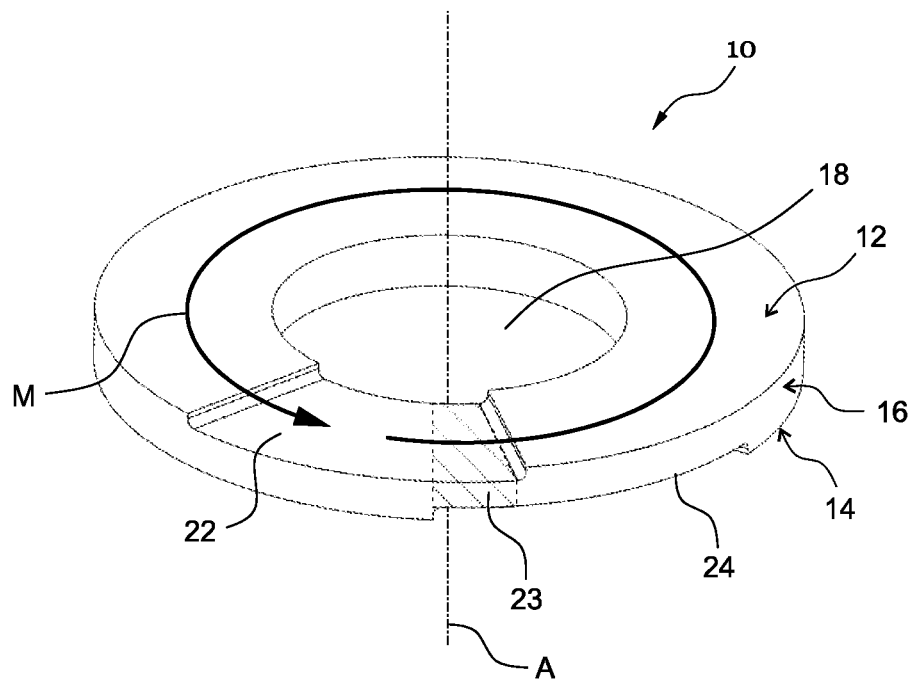
FIG. 2 is a schematic perspective view of a further example of a magnetostrictive body.

FIG. 2 shows a magnetostrictive body 10 according to another example. Unless otherwise indicated, the magnetostrictive body 10 of FIG. 2 may have similar, same or corresponding structural and/or functional features of the example of FIG. 1. In the present disclosure, the features that are common to the different examples are not repeated for the sake of conciseness. The magnetostrictive body 10 of FIG. 2 differs from the example shown in FIG. 1 by a through opening 18 that is formed at the center of the magnetostrictive body 10. The through opening 18 may have the shape of a hollow cylinder formed symmetrically around the symmetry axis A. The through opening 18 opens to both the first end surface 12 and the second end surface 14. In contrast to the recesses 22, 24, the through opening 18 provides a continuous opening between the end surfaces 12, 14 with no material of the magnetostrictive body 10 remaining therebetween.

The resulting shape of the magnetostrictive body 10 in the example of FIG. 2 may be referred to as an annular ring. The through opening 18 may be utilized to receive, engage with, be mounted on or otherwise be coupled to a mechanical stress transferring element (see e.g. FIG. 3), such as an anvil, a stage, a plate, a shaft or the like. The application of a mechanical stress S to the magnetostrictive body 10 perpendicular to the first end surface 12 and/or the second end surface 14 results in a distortion of the magnetostrictive body 10 particularly in the overlap portion 23 and in a magnetic field vector emerging from the magnetostrictive body 10 in the manner described above.

Figure 3:
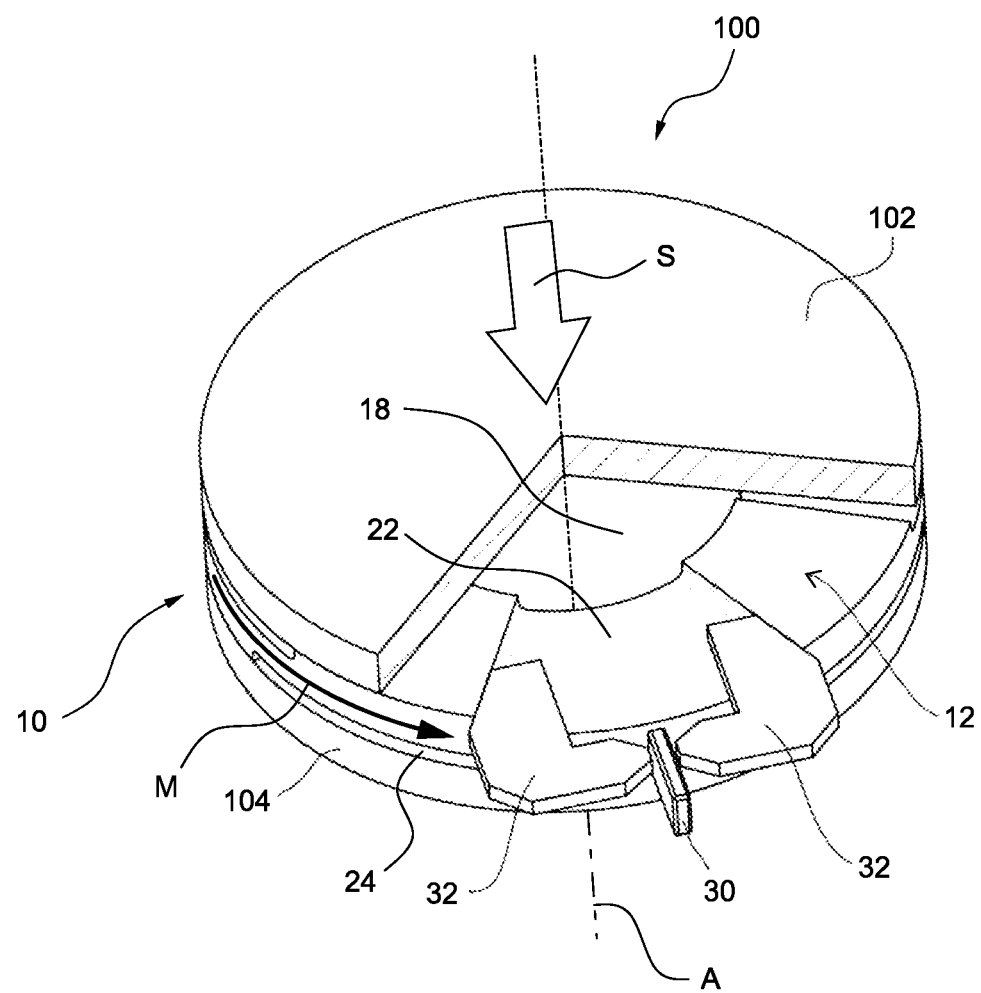
FIG. 3 is a schematic perspective view of a device and a mechanical stress transferring element.

FIG. 3 shows a device 100 for measuring mechanical stress. The device 100 comprises a magnetostrictive body 10, which may be any of the examples described above with reference to FIGS. 1 and 2 or any of the examples disclosed herein. The magnetostrictive body 10 is sandwiched between two mechanical stress transferring elements 102, 104 that are attached to the first and second end surfaces 12, 14, respectively. In the example of FIG. 3, the mechanical stress transferring elements 102, 104 are illustrated as planar plates. Further examples may include anvils, shafts, stages, etc. Moreover, any or both of the mechanical stress transferring elements 102, 104 as illustrated in FIG. 3 may depict a respective end portion of a larger element.

The device too further comprises a magnetic field sensor 30 configured to measure magnetic field vectors. Further, the device too comprises a pair of magnetic flux conducting elements 32 arranged between the magnetostrictive body 10 and the magnetic field sensor 30. The magnetic flux conducting elements 32 may further be configured to hold the magnetic field sensor 30 as illustrated in FIG. 3. In the example of FIG. 3, the magnetic flux conducting elements 32 may be provided as a pair of clamps. In other examples, the magnetic field sensor 30 may be attached to the magnetostrictive body 10 by gluing, inserting or any other proper means. The magnetic flux conducting elements 32 may further be configured to collect the magnetic field vectors emerging from the magnetostrictive body 10 such as to forward the collected magnetic field vectors to the magnetic field sensor 30.

Any or both of the mechanical stress transferring elements 102, 104 may transfer a mechanical stress S to the magnetostrictive body 10 in a direction perpendicular to the respective end surface 12, 14. In the present disclosure, the direction of the mechanical stress S may deviate from the direction perpendicular to the end surface 12, 14 which the mechanical stress S is applied to. In such cases, a component of the mechanical stress that is perpendicular to the receiving first and/or second end surface 12, 14 may be considered. Alternatively or additionally, the device too may be capable of determining a direction of the acting mechanical stress.

In response to the mechanical stress S being applied to the magnetostrictive body to, the magnetostrictive body 10 may perform a distortion in the above described manner. As a result, a magnetic field vector of the remanent magnetization M enclosed in the magnetostrictive body 10 may emerge from the magnetostrictive body 10. Depending on the sensitivity of the device too and the received mechanical stress S, the emerging magnetic field vector may be detectable and quantifiable by the magnetic field sensor 30 that is arranged adjacent to the first end surface 12 outside of the magnetostrictive body 10. The mechanical stress S may be calculated from the measured magnetic field vector.

Figure 4:
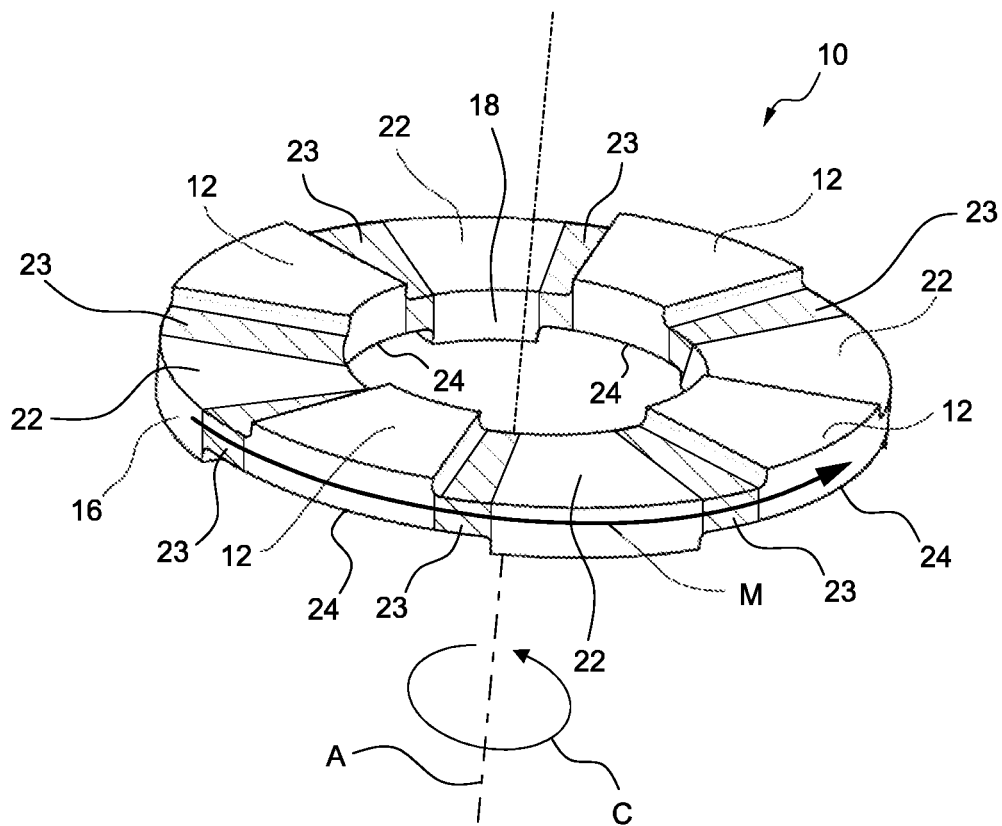
FIG. 4 is a schematic perspective view of a further example of a magnetostrictive body.

FIG. 4 shows another example of a magnetostrictive body 10. The magnetostrictive body of FIG. 4 has four first recesses 22 formed on the first end surface 12 and four second recesses 24 formed on the second end surface 14. The magnetostrictive body 10 further comprises a through opening 18, which is an optional structural feature. The first recesses 22 are formed as circular segments and are spaced from one another in the circumferential direction C. As a result, the first recesses 22 and non-recessed portions of the first end surface 12 repeat in an alternating manner. The same applies to the second recesses 24 and the second end surface 14 on the opposite side.

In the projection P perpendicular to the first end surface 12 and/or the second end surface 14, each of the first recesses 22 overlaps two second recesses 24 and extends beyond the same two second recesses 24. Similarly, each of the second recesses 24 overlaps two first recesses 22 and extends beyond the same two first recesses 22. Accordingly, each of the first and second recesses 22, 24 overlap in two overlap portions 23 that are particularly susceptible to distortion in response to a mechanical stress. The overlap portions 23 are particularly highlighted in FIG. 5, which shows a plan view of the magnetostrictive body according to the example of FIG. 4.

Figure 5:
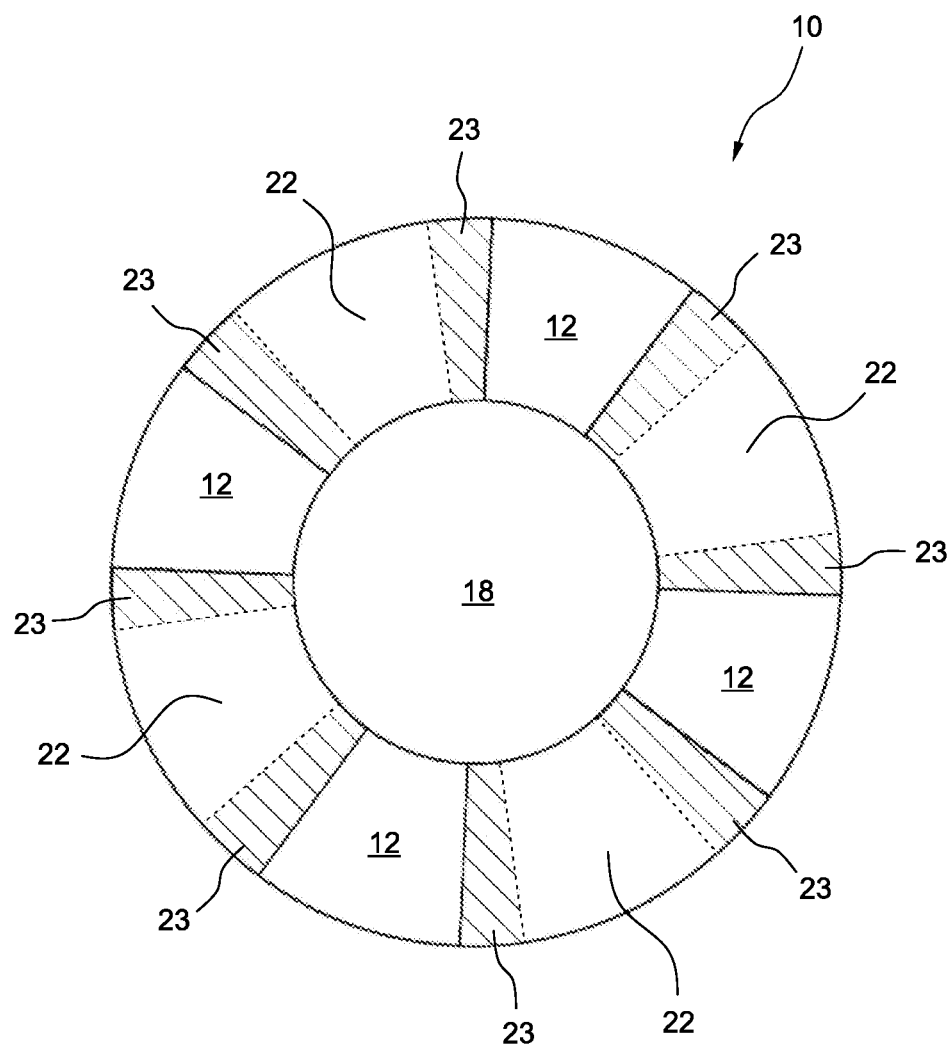
FIG. 5 is a schematic plan view of the magnetostrictive body of FIG. 4.
Figure 6:
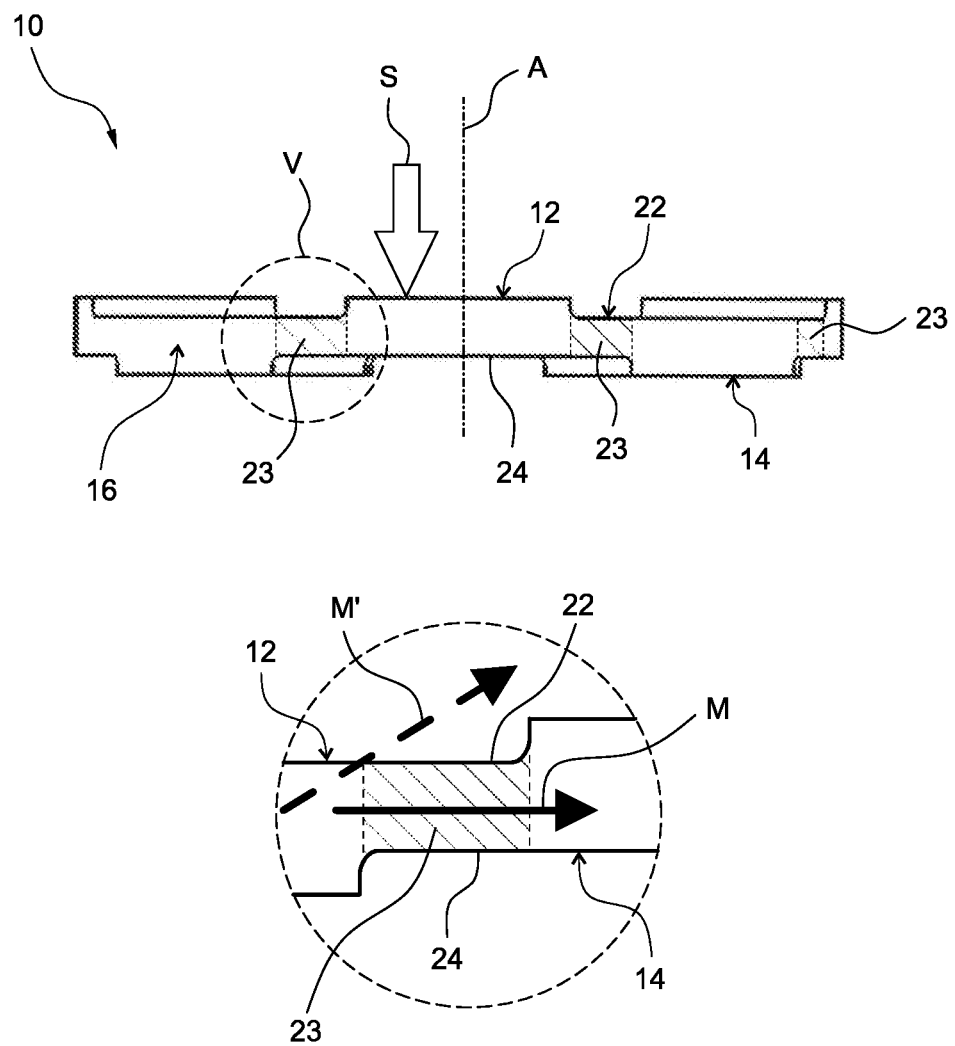
FIG. 6 is a schematic front view of the magnetostrictive body of FIGS. 4 and 5.

FIG. 6 shows a front view of the magnetostrictive body 10 according to the example of FIGS. 4 and 5. In FIG. 6, a solid arrow M illustrates the remanent magnetization M enclosed in the magnetostrictive body 10 in absence of a mechanical stress, i.e. in an initial alignment. In the example shown in FIGS. 4 to 6, the initial alignment of the remanent magnetization M may be substantially parallel to the first end surface 12 and the second end surface 14.

When a mechanical stress S is applied to the magnetostrictive body 10 in a direction perpendicular to the first end surface 12 as depicted in FIG. 6, the magnetostrictive body m performs distortion in the above described manner. As described above, the distortion particularly occurs in the overlap portions 23, causing magnetic field vectors of the remanent magnetization M to deflect from the initial alignment and to emerge from the magnetostrictive body 10, as symbolized by a dashed arrow M' in a partial view V in FIG. 6. Here, the deflection of the magnetic field vector M' as illustrated in FIG. 6 may be exaggerated to facilitate the understanding of the working principle of the claimed subject matter. However, depending on the structure and setup, the deflected magnetic field vector M' may even be more inclined from the initial alignment of the remanent magnetization M than as illustrated in FIG. 6. Moreover, the deflected magnetic field vector M' as illustrated in FIG. 6 may comprise further components depending on the geometry of the magnetostrictive body 10 and the applied mechanical stress. For example, the deflected magnetic field vector M' may have a component parallel to the symmetry axis A. It is understood that the example shown in FIG. 6 is for illustration purpose only and may not exactly depict the real-world magnetic field vectors. Consequently, the magnetic field vector M' becomes measurable outside of the magnetostrictive body 10 by a magnetic field sensor arranged adjacent to the first end surface 12 and/or in the first recess 22. The applied mechanical stress S (magnitude and/or direction) may be determined on this basis.

Figure 7:
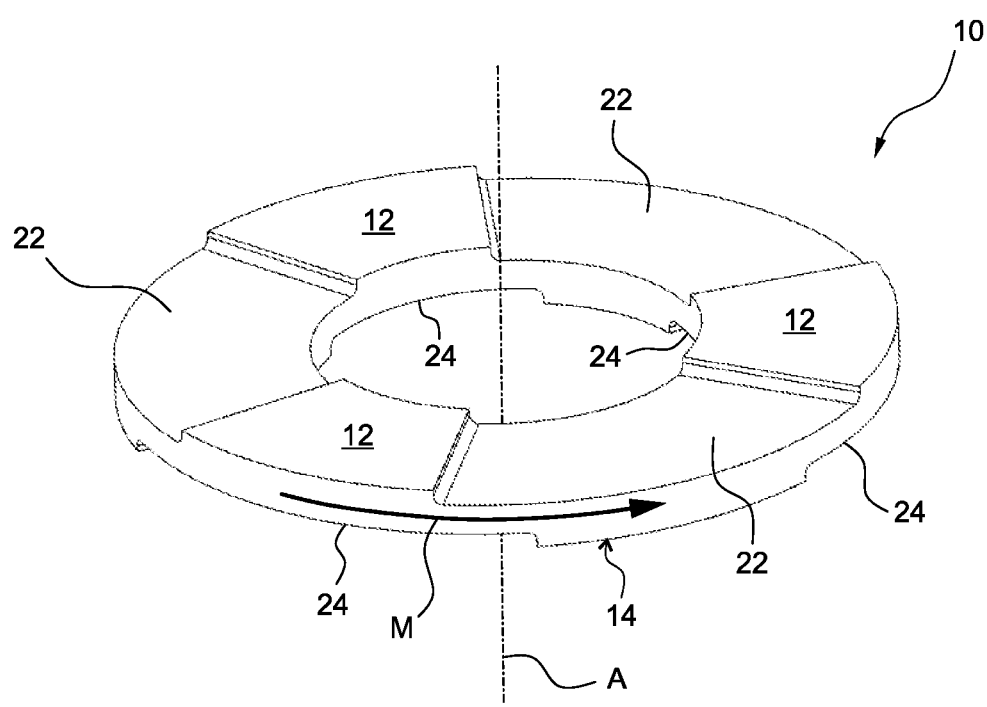
FIG. 7 is a schematic perspective view of a further example of a magnetostrictive body.
Figure 8:
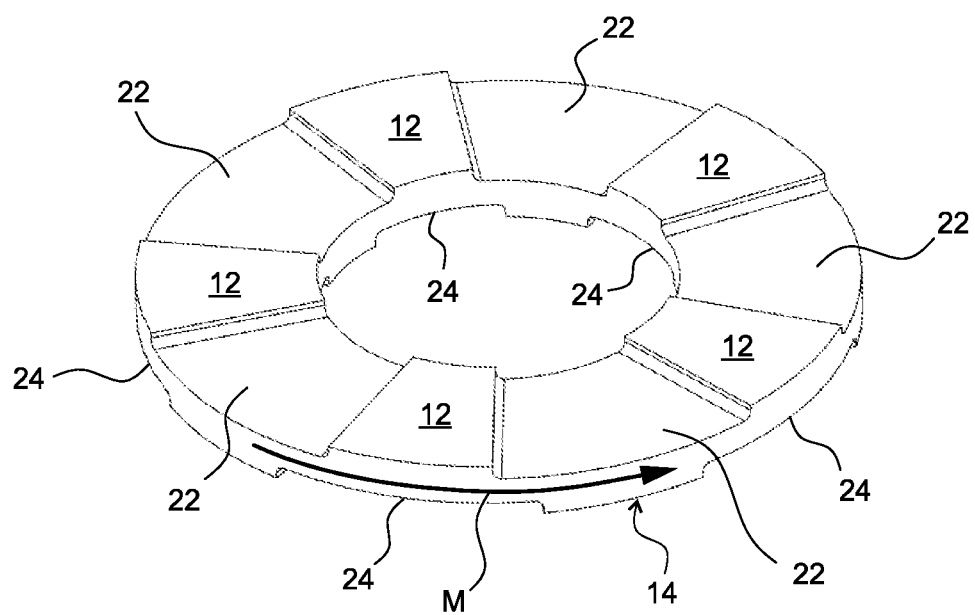
FIG. 8 is a schematic perspective view of a further example of a magnetostrictive body.

FIGS. 7 and 8 show further examples of a magnetostrictive body 10. The examples of FIGS. 7 and 8 are similar to the magnetostrictive body 10 of FIGS. 4 to 6 and differ therefrom in the number of the first and second recesses 22, 24. The magnetostrictive body 10 of FIG. 7 has three first recesses 22 and three second recesses 24, while the magnetostrictive body 10 of FIG. 8 has five first recesses 22 and five second recesses 24. The numbers of the first and second recesses 22, 24 may further vary in accordance with requirements to the device, such as dimensions, shape and/or material of the magnetostrictive body 10, as well as the respective application, installment and objective.

In the examples described with reference to FIGS. 7 and 8 and described below with reference to FIGS. 9 to 12, the respective magnetostrictive body 10 encloses a remanent magnetization M in the above described manner, whereby in these drawings the remanent magnetization M is illustrated in a simplified manner. In particular, the remanent magnetization M in any of these examples may form a closed loop inside the magnetostrictive body 10.

Figure 9:
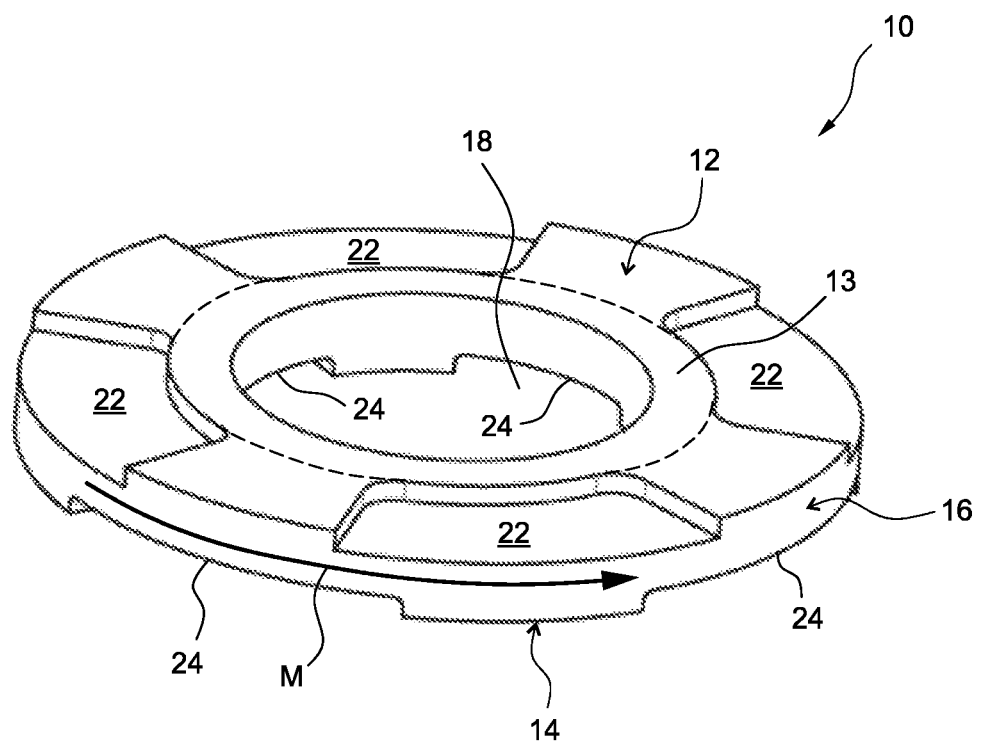
FIG. 9 is a schematic perspective view of a further example of a magnetostrictive body.

FIG. 9 shows yet another example of a magnetostrictive body 10. The magnetostrictive body 10 of FIG. 9 has four first recesses 22 and four second recesses 24 similar to the example of FIGS. 4 to 6 and differs therefrom in that the first recesses 22 partially extend in the radial direction from the lateral surface 16 towards the through opening 18. Accordingly, the first end surface 12 has a circumferential portion 13 that is continuously formed around the through opening 18.

In other examples, the circumferential portion 13 may be formed in a further radially outside position from around the through opening 18 (not shown). Accordingly, the first recesses 22 may be split into two radially separated portions. In other not shown examples, another circumferential portion may be formed in a position radially outward from the circumferential portion 13 shown in FIG. 9, resulting in the first recesses 22 being split into more than two radially separated portions. In yet further not shown examples, the circumferential portion 13 may be formed along the lateral surface 16 and the first recesses 22 may be located radially inside. Any of these examples may apply to the opposite side of the magnetostrictive body 10 with reference to the second end surface 14 and the second recesses 24.

Furthermore, as stated above, the through opening 18 is an optional structural feature. Hence, the central portion of the magnetostrictive body 10 may be solid and coplanar with either the first end surface 12 or the first recesses 22. The same may apply to the opposite side of the magnetostrictive body 10 with reference to the second end surface 14 and the second recesses 24.

Figure 10:
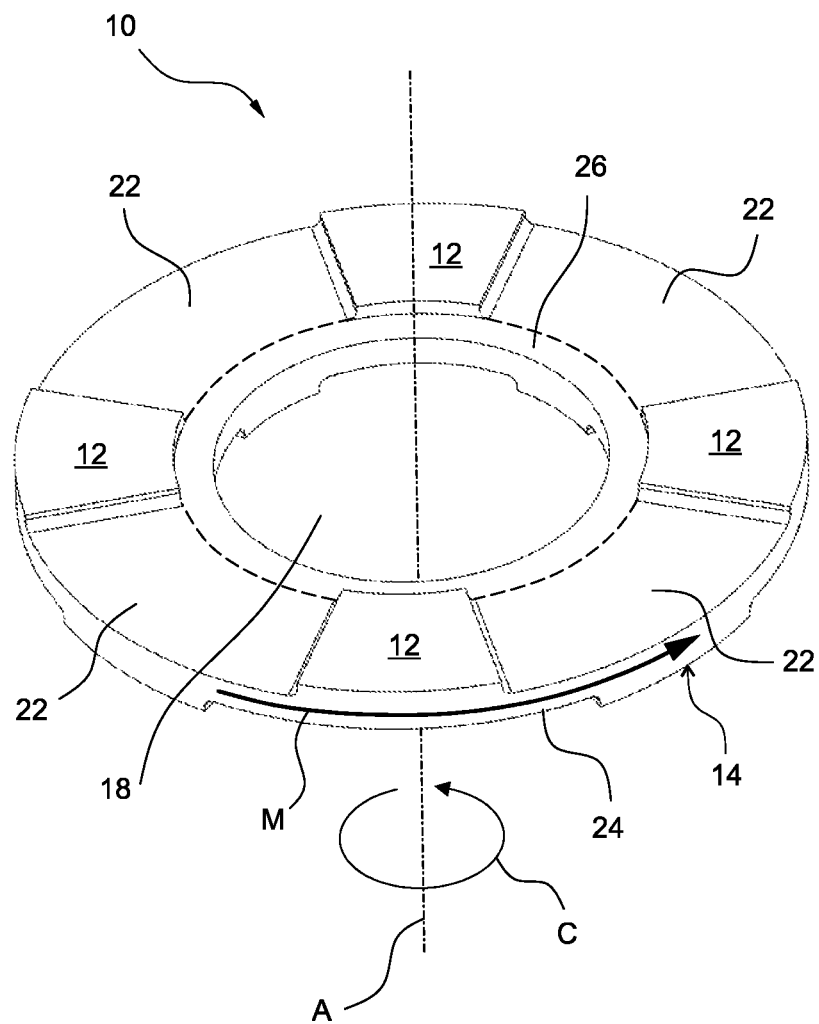
FIG. 10 is a schematic perspective view of a further example of a magnetostrictive body.
Figure 11:
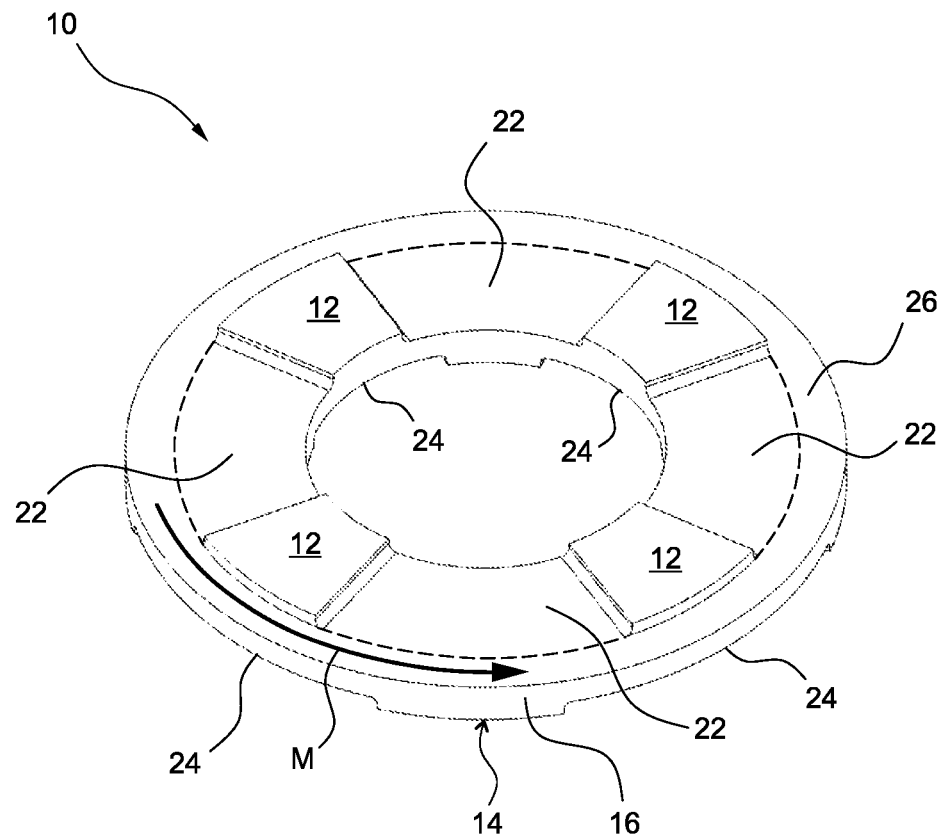
FIG. 11 is a schematic perspective view of a further example of a magnetostrictive body.
Figure 12:
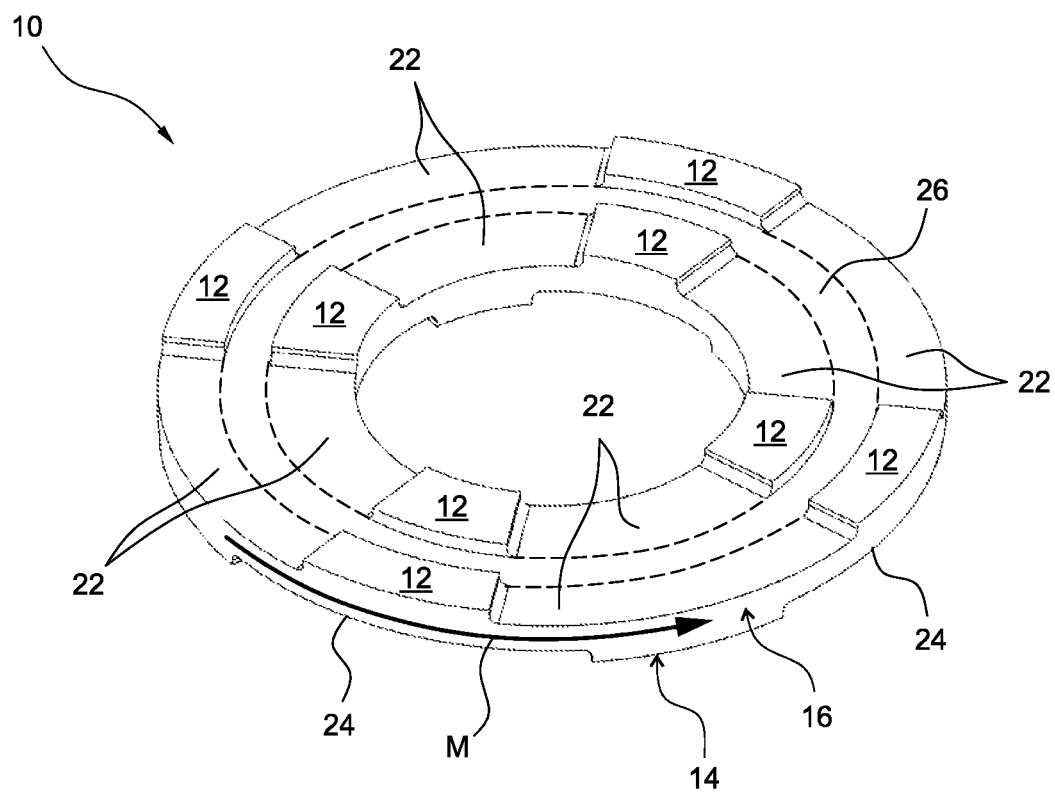
FIG. 12 is a schematic perspective view of a further example of a magnetostrictive body.

In further examples shown in FIGS. 10, 11 and 12, the first end surface 12 of the magnetostrictive body 10 may be further recessed continuously in the circumferential direction C. Accordingly, a circumferential recess 26 is formed that extends continuously around the symmetry axis and around the through opening 18 if applicable. The examples of FIG. 10 to 12 differ from one another in the radial position of the circumferential recess 26. In FIG. 10, the circumferential recess 26 is formed just around the through opening 18. In FIG. 11, the circumferential recess 26 is formed in a radially outermost position adjacent to the lateral surface 16.

In FIG. 12, the circumferential recess 26 is formed radially outside of the through opening 18 but inside of the lateral surface 16, thereby dividing the first end surface 12 into radially separated portions. Any of these examples may apply also to the opposite side of the magnetostrictive body 10 with reference to the second end surface 14 and the second recesses 24.

Figure 13:
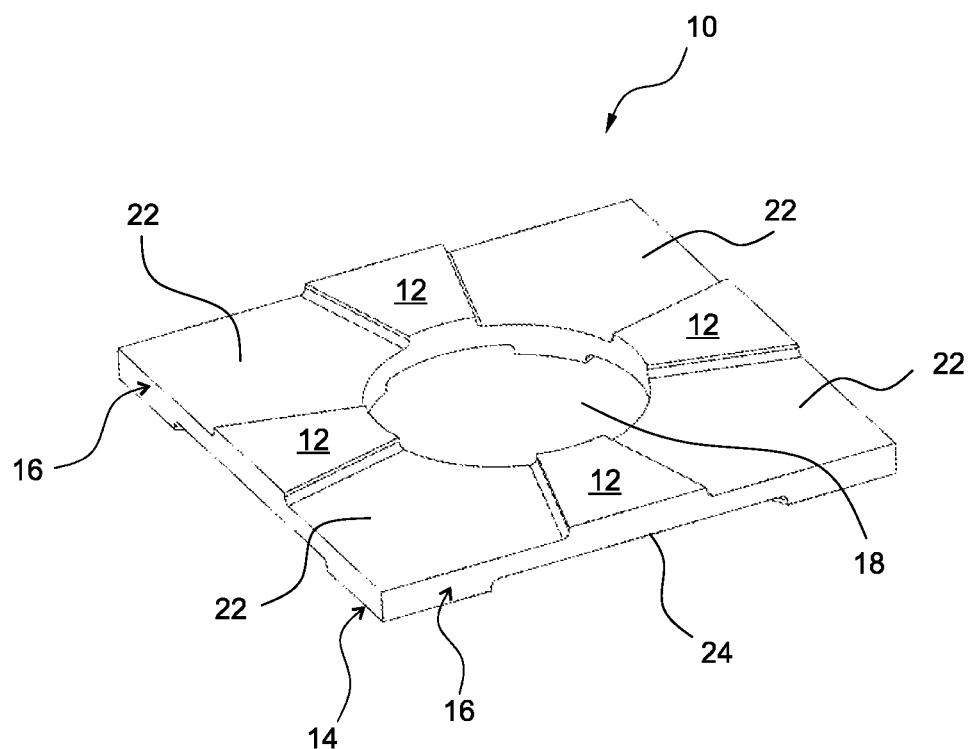
FIG. 13 is a schematic perspective view of a further example of a magnetostrictive body.
Figure 14:
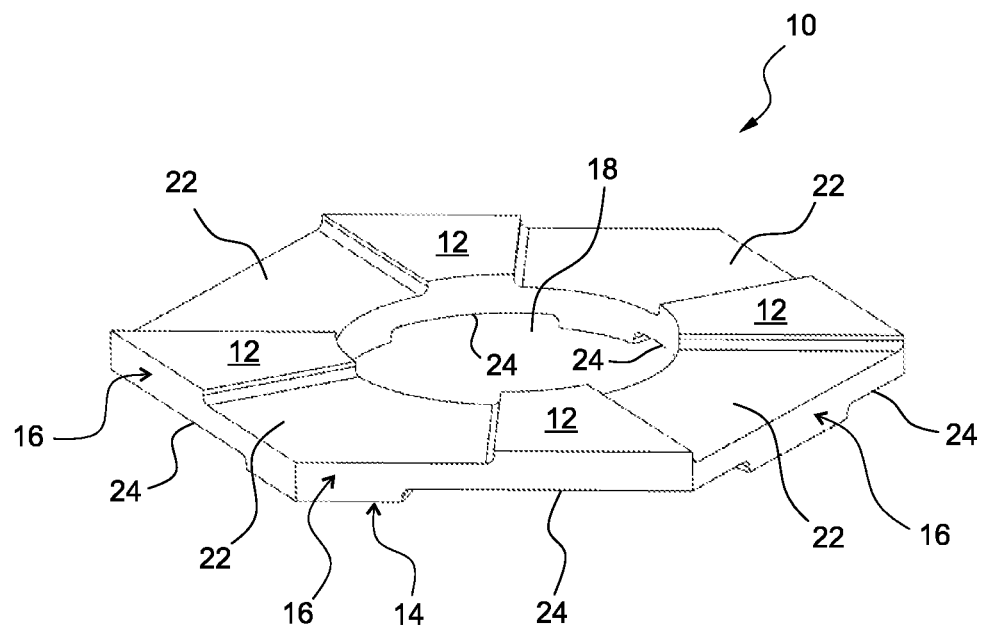
FIG. 14 is a schematic perspective view of a further example of a magnetostrictive body.

FIGS. 13 and 14 show further examples of a magnetostrictive body 10 each having four first recesses 22 formed on the respective first end surface 12 and four second recesses 24 formed on the respective second end surface 14. While in the examples described so far with reference to FIGS. 1 to 12, the magnetostrictive body 10 has a circular symmetrical basis shape, i.e. a disk shape or an annular shape, in the examples of FIGS. 13 and 14 the magnetostrictive body 10 has a polygonal shape. The magnetostrictive body 10 of FIG. 13 has the basis shape of a rectangular plate. The magnetostrictive body 10 of FIG. 13 has the basis shape of a hexagonal plate. Both examples of FIGS. 13 and 14 are distinct rotational symmetrical, i.e. repeats the same shape at distinct rotation angles around a symmetry axis. In further not shown examples, the basis shape of the magnetostrictive body 10 may be any other polygonal plate.

The magnetostrictive body 10 according to each of the examples of FIGS. 13 and 14 as well encloses a remanent magnetization in the above described manner. In particular, the magnetostrictive body 10 may enclose a closed loop of the remanent magnetization. Since the magnetostrictive body 10 is not circular symmetrical, the enclosed remanent magnetization may deviate from a substantially circular shape as illustrated in FIG. 1. For example, the enclosed remanent magnetization may have portions protruding towards corners of the respective magnetostrictive body 10. The magnitude and shape of the remanent magnetization may be determined in accordance with the laws of electrodynamics taking into account the shape, dimensions and material of the magnetostrictive body 10.

Any of the examples of the magnetostrictive body 10 illustrated and/or described in the present disclosure may be used in a device for measuring mechanical stress based on the functional principle as above described.

Furthermore, any of the described magnetostrictive body 10 and the corresponding device may be manufactured by aligning an external magnetic field relative to the magnetostrictive body 10, rotating the magnetostrictive body 10 and/or moving the magnetostrictive body 10 around the magnetic field while being exposed to the external magnetic field so as to induce magnetization in the magnetostrictive body 10, and maintaining the external magnetic field while rotating the magnetostrictive body 10 such that the remanent magnetization is enclosed in the magnetostrictive body 10. In particular, the magnetostrictive body 10 may be rotated and/or moved around a rotation axis perpendicular to the desired remanent magnetization. Here, the rotating or moving around may refer to a substantially circular, elliptical or any other proper periodical motion suitable for inducing a closed loop of remanent magnetization in the magnetostrictive body 10.

Figure 15:
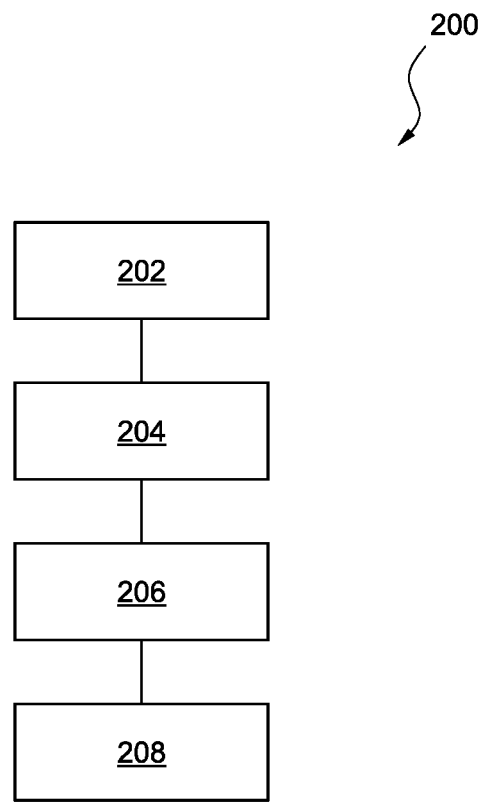
FIG. 15 is a flow diagram of a method.

FIG. 15 shows a flow diagram of a method 200 for measuring mechanical stress. The method may be performed in combination with any of the above described examples of a device and/or of a magnetostrictive body 10.

According to the method 200, at 202, the device or any of its examples as described above is provided. In particular, the provided device 100 comprises any of the magnetostrictive body 10 as described above.

At 204, a mechanical stress is applied to the magnetostrictive body 10 in a first direction perpendicular to the first end surface 12. Alternatively or additionally, the mechanical stress may be applied to the second end surface 14. The mechanical stress S may refer to a perpendicular component of an applied mechanical stress.

In response to the applied mechanical stress, the magnetostrictive body performs a distortion in the above described manner. As a result, the remanent magnetization enclosed in the magnetostrictive body is deflected, causing a magnetic field vector of the remanent magnetization to emerge from the magnetostrictive body. At 206, the magnetic field vector emerging from the magnetostrictive body in a direction inclined from the first direction, i.e. from a direction perpendicular to the first end surface, is measured. The measurement may be performed using a magnetic field sensor as described above.

At 208, the acting mechanical stress is determined from the measured magnetic field vector. Accordingly, the device and the method as disclosed herein provides means for measuring a mechanical stress that is applied perpendicular to an end surface of the magnetostrictive body. The device and the corresponding method may be cost effective and simple to be prepared. The disclosed subject matter may provide sufficient robustness and rigidity against the mechanical stress to be measured, in particular in the direction of the applied mechanical stress. Moreover, the disclosed subject matter may exhibit a sufficient inelasticity and/or sufficient mechanical stability against deformation during operation. Further, the device and method may be robust particularly against environmental influences and disturbances.

LIST OF REFERENCE SIGNS

10 magnetostrictive body
12 first end surface
13 circumferential portion
14 second end surface
16 lateral surface
18 through opening
22 first recess
23 overlap portion
24 second recess
26 circumferential recess
30 magnetic field sensor
32 magnetic flux conducting elements
100 device
200 method
202-208 method steps
A symmetry axis
C circumferential direction
E layer
M remanent magnetization
M' deflected remanent magnetization; magnetic field vector
P projection direction
S mechanical stress
V partial view

What is claimed is:

1. A device for measuring mechanical stress comprising a magnetostrictive body enclosing a remanent magnetization, wherein the magnetostrictive body comprises:
    a first end surface and a second end surface arranged opposite to each other, wherein at least one of the first and second end surfaces is configured to receive a mechanical stress; and
    a first recess formed at the first end surface towards the second end surface and a second recess formed at the second end surface towards the first end surface,
    wherein, in a projection perpendicular to the first end surface, the first recess overlaps the second recess and extends beyond the second recess.

2. The device of claim 1, further comprising
    a magnetic field sensor arranged adjacent to one of the first end surface and the second end surface, the magnetic field sensor configured to measure a magnetic field vector emerging from the magnetostrictive body in response to a mechanical stress.

3. The device of claim 1,
    wherein the magnetostrictive body has a symmetric shape with respect to a symmetry axis perpendicular to the first end surface.

4. The device of claim 3,
    wherein the magnetostrictive body further comprises a through opening formed around the symmetry axis.

5. The device of claim 3,
    wherein one or both of the first recess and the second recess extend in a radial direction with respect to the symmetry axis.

6. The device of claim 3,
    wherein multiple first recesses are formed in the first end surface such that the multiple first recesses are spaced from one another in a circumferential direction with respect to the symmetry axis,
    wherein, in the projection perpendicular to the first end surface, at least one of the multiple first recesses overlaps the second recess and extends beyond the second recess.

7. The device of claim 6,
    wherein multiple second recesses are formed in the second end surface such that the multiple second recesses are spaced from one another in the circumferential direction with respect to the symmetry axis,
    wherein the multiple first and second recesses are formed such that, in the projection perpendicular to the first end surface, each of the multiple first recesses partially overlaps one or more of the multiple second recesses and extends beyond the same.

8. The device of claim 3,
    wherein the magnetostrictive body further comprises at least one circumferential recess formed at the first end surface towards the second end surface,
    wherein the at least one circumferential recess is formed rotational symmetrically around the symmetry axis.

9. The device of claim 1,
    wherein the magnetostrictive body has an annular plate or annular cylinder shape with the first end surface and the second end surface being parallel to each other.

10. The device of claim 1,
    wherein the remanent magnetization enclosed in the magnetostrictive body is arranged such as to be substantially parallel to one or both of the first end surface and the second end surface.

11. The device of claim 1,
    wherein the first recess extends towards the second end surface by a first depth measured from and perpendicular to the first end surface, and the second recess extends towards the first end surface by a second depth measured from and perpendicular to the second end surface,
    wherein the sum of the first depth and the second depth is smaller than a distance between the first end surface and the second end surface.

12. The device of claim 1,
wherein the remanent magnetization enclosed in the magnetostrictive body is equivalent to a magnetic flux density of 0.001 T to 1.0 T.

13. The device of claim 1,
wherein the remanent magnetization enclosed in the magnetostrictive body is equivalent to a magnetic flux density of 0.005 T to 0.5 T.

14. The device of claim 1,
wherein the remanent magnetization enclosed in the magnetostrictive body is equivalent to a magnetic flux density of 0.01 T to 0.3 T.

15. The device of claim 1, further comprising
a magnetic field sensor arranged adjacent to one of the first end surface and the second end surface, the magnetic field sensor configured to measure a magnetic field vector emerging from the magnetostrictive body in response to a mechanical stress,
wherein the magnetostrictive body has a symmetric shape with respect to a symmetry axis perpendicular to the first end surface, and wherein the magnetostrictive body further comprises a through opening formed around the symmetry axis.

16. The device of claim 15,
wherein multiple first recesses are formed in the first end surface such that the multiple first recesses are spaced from one another in a circumferential direction with respect to the symmetry axis,
wherein, in the projection perpendicular to the first end surface, at least one of the multiple first recesses overlaps the second recess and extends beyond the second recess.

17. The device of claim 1,
wherein the magnetostrictive body has an annular plate or annular cylinder shape with the first end surface and the second end surface being parallel to each other, wherein the remanent magnetization enclosed in the magnetostrictive body is arranged such as to be substantially parallel to one or both of the first end surface and the second end surface.

18. A method of manufacturing the device of claim 1, comprising:
enclosing the remanent magnetization in the magnetostrictive body by performing at least one of the following:
applying an external magnetic field to the magnetostrictive body while rotating the magnetostrictive body relative to the external magnetic field;
applying an external magnetic field to the magnetostrictive body while moving the magnetostrictive body in a closed loop relative to the external magnetic field;
applying an external magnetic field to the magnetostrictive body and periodically varying one or both of an orientation and a magnitude of the external magnetic field relative to the magnetostrictive body; and
applying an electric current through the magnetostrictive body and varying one or both of a direction and a magnitude of the electric current.

19. The method of claim 18,
wherein at least one of the first recess and the second recess is formed by performing one or both of a milling process and an extrusion at one or both of the first surface and at the second surface, respectively, of the magnetostrictive body.

20. A method for measuring mechanical stress, comprising:
providing the device of claim 1;
applying a mechanical stress to the magnetostrictive body in a first direction perpendicular to the first end surface;
measuring a magnetic field vector emerging from the magnetostrictive body in a direction inclined from the first direction; and
determining the mechanical stress from the measured magnetic field vector.

* * * * *